(12) United States Patent
Spencer

(10) Patent No.: US 11,280,884 B2
(45) Date of Patent: Mar. 22, 2022

(54) LIDAR INSTRUMENT AND METHOD FOR OPERATING A LIDAR INSTRUMENT

(71) Applicant: Photodigm Inc., Richardson, TX (US)

(72) Inventor: John Edward Spencer, Plano, TX (US)

(73) Assignee: PHOTODIGM INC., Richardson, TX (US)

( * ) Notice: Subject to any disclaimer, the term of this patent is extended or adjusted under 35 U.S.C. 154(b) by 0 days.

(21) Appl. No.: 17/270,575

(22) PCT Filed: Aug. 23, 2019

(86) PCT No.: PCT/US2019/047961
§ 371 (c)(1),
(2) Date: Feb. 23, 2021

(87) PCT Pub. No.: WO2020/046750
PCT Pub. Date: Mar. 5, 2020

(65) Prior Publication Data
US 2021/0311170 A1     Oct. 7, 2021

Related U.S. Application Data

(60) Provisional application No. 62/725,151, filed on Aug. 30, 2018.

(51) Int. Cl.
*G01C 3/08* (2006.01)
*G01S 7/481* (2006.01)
(Continued)

(52) U.S. Cl.
CPC .......... *G01S 7/4814* (2013.01); *G01S 7/4816* (2013.01); *G01S 7/4865* (2013.01); *G01S 17/58* (2013.01); *H01S 5/125* (2013.01); *H01S 5/40* (2013.01)

(58) Field of Classification Search
CPC .... G01S 7/4814; G01S 7/4816; G01S 7/4865; G01S 17/58; H01S 5/125; H01S 5/40
See application file for complete search history.

(56) References Cited

U.S. PATENT DOCUMENTS 5,680,241 A     10/1997  Sakanaka et al.
6,376,269 B1 *   4/2002  Chen ............... H01S 5/18341
                                            372/50.11
(Continued)

FOREIGN PATENT DOCUMENTS

WO    2015022148 A1    2/2015
WO    WO022148 A1 *    2/2015  ............... H01S 3/10

*Primary Examiner* — Mark Hellner
(74) *Attorney, Agent, or Firm* — Slater Matsil, LLP

(57) ABSTRACT

A LIDAR instrument and a method for operating a LIDAR instrument are disclosed. In an embodiment a LIDAR instrument includes a transmitter including a narrow band laser diode configured to emit light in a spectral envelope of 2 nm or less around a central wavelength, wherein the spectral envelope overlaps with an atmospheric molecular absorption band in which a solar radiation is attenuated by at least 3 dB compared to an adjacent non-spectrally-attenuated wavelength band, wherein molecular absorption in the atmospheric molecular absorption band is due to water vapor, carbon dioxide, oxygen, ozone methane, or nitrous oxide and wherein the atmospheric molecular absorption band is located between 700 nm and 10,000 nm, and a detector including a filter configured to receive a reflected light in a band of 5 nm or less around the central wavelength.

19 Claims, 5 Drawing Sheets

(51) Int. Cl.
  *G01S 7/4865* (2020.01)
  *G01S 17/58* (2006.01)
  *H01S 5/125* (2006.01)
  *H01S 5/40* (2006.01)

(56) References Cited

U.S. PATENT DOCUMENTS

| | | |
|---|---|---|
| 7,773,204 B1 | 8/2010 | Nelson |
| 8,223,340 B2 * | 7/2012 | Digonnet ............. G01C 19/721 |
| | | 356/460 |
| 8,718,918 B2 | 5/2014 | Roberts |
| 9,007,569 B2 | 4/2015 | Amzajerdian et al. |
| 9,869,754 B1 | 1/2018 | Campbell et al. |
| 2015/0233962 A1 * | 8/2015 | Tchoryk ................ G01S 7/4818 |
| | | 356/28.5 |
| 2018/0231659 A1 * | 8/2018 | Campbell ............... G01S 17/26 |
| 2019/0018139 A1 * | 1/2019 | Sayyah .................. H01S 5/125 |

* cited by examiner

LIDAR INSTRUMENT AND METHOD FOR OPERATING A LIDAR INSTRUMENT

CROSS-REFERENCE TO RELATED APPLICATIONS

This application is a national stage application of International Application No. PCT/US2019/047961, filed on Aug. 23, 2019, which claims priority to U.S. Provisional Application No. 62/725,151, filed on Aug. 30, 2018, which applications are hereby incorporated herein by reference.

TECHNICAL FIELD

The present invention relates generally to a LIDAR instrument and a method for operating a LIDAR instrument.

BACKGROUND

LIDAR (Light Detection and Ranging) originated in the early 1960s, shortly after the invention of the laser, and combined laser-focused imaging with the ability to calculate distances by measuring the time for a signal to return using appropriate sensors and data acquisition electronics. LIDAR uses ultraviolet, visible, or infrared light to image objects. It can target a wide range of materials including non-metallic objects, rocks, rain, chemical compound, aerosols, clouds and even single molecules. A laser beam can map physical features with very high resolutions, for example, an aircraft can map terrain at 30-centimetre (12 in) resolution or better.

Currently, high power laser diodes at 905 nm are commonly used for LIDAR due to their ready availability, high reliability, high power, and low cost. High power at a wavelength of 905 nm is used to overcome high daytime solar background intensities. 1550 nm laser diodes used for fiber optic telecommunications are also readily available. However, they are generally low power and must be used with a fiber amplifier to be suitable for LIDAR.

SUMMARY

In accordance with an embodiment of the present invention, a LIDAR instrument includes a transmitter including a narrow band laser diode configured to emit light in a spectral envelope of 2 nm or less around a central wavelength, wherein the spectral envelope overlaps with an atmospheric molecular absorption band in which a solar radiation is attenuated by at least 3 dB compared to an adjacent non-spectrally-attenuated wavelength band, wherein molecular absorption in the atmospheric molecular absorption band is due to water vapor, carbon dioxide, oxygen, ozone, methane, or nitrous oxide and wherein the atmospheric molecular absorption band is located between 700 nm and 10,000 nm, and a detector including a filter configured to receive a reflected light in a band of 5 nm or less around the central wavelength.

In accordance with another embodiment of the present invention, a method for operating a vehicle with a LIDAR instrument, wherein the LIDAR instrument comprises a transmitter include a single mode laser diode configured to emit light in a spectral envelope of 2 nm or less around a central wavelength, wherein the central wavelength overlaps with an atmospheric molecular absorption band in which solar radiation is attenuated by at least 3 dB compared to an adjacent non-spectrally-attenuated wavelength band, wherein molecular absorption in the atmospheric molecular absorption band is due to water vapor, carbon dioxide, oxygen, ozone, methane, or nitrous oxide and wherein the atmospheric molecular absorption band is located between 700 nm and 10,000 nm, and a detector including a matching filter configured to receive a reflected light in a band of 5 nm or less, wherein the method include operating the vehicle based on measurements of the LIDAR instrument.

In accordance with a further embodiment of the present invention, a LIDAR instrument includes a transmitter including a narrow band laser diode configured to emit light in a spectral envelope of 2 nm or less around a central wavelength, wherein the emitted light comprises a coherence length of equal to or more than 10 meters and a detector including a filter configured to receive a reflected light and configured to measure a phase shift in the reflected light.

In accordance with yet a further embodiment of the present invention, a LIDAR instrument includes a transmitter including a narrow band laser diode configured to emit light in a spectral envelope of 2 nm or less around a central wavelength and a detector including a filter configured to receive a reflected light in a band of 5 nm or less around the central wavelength.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
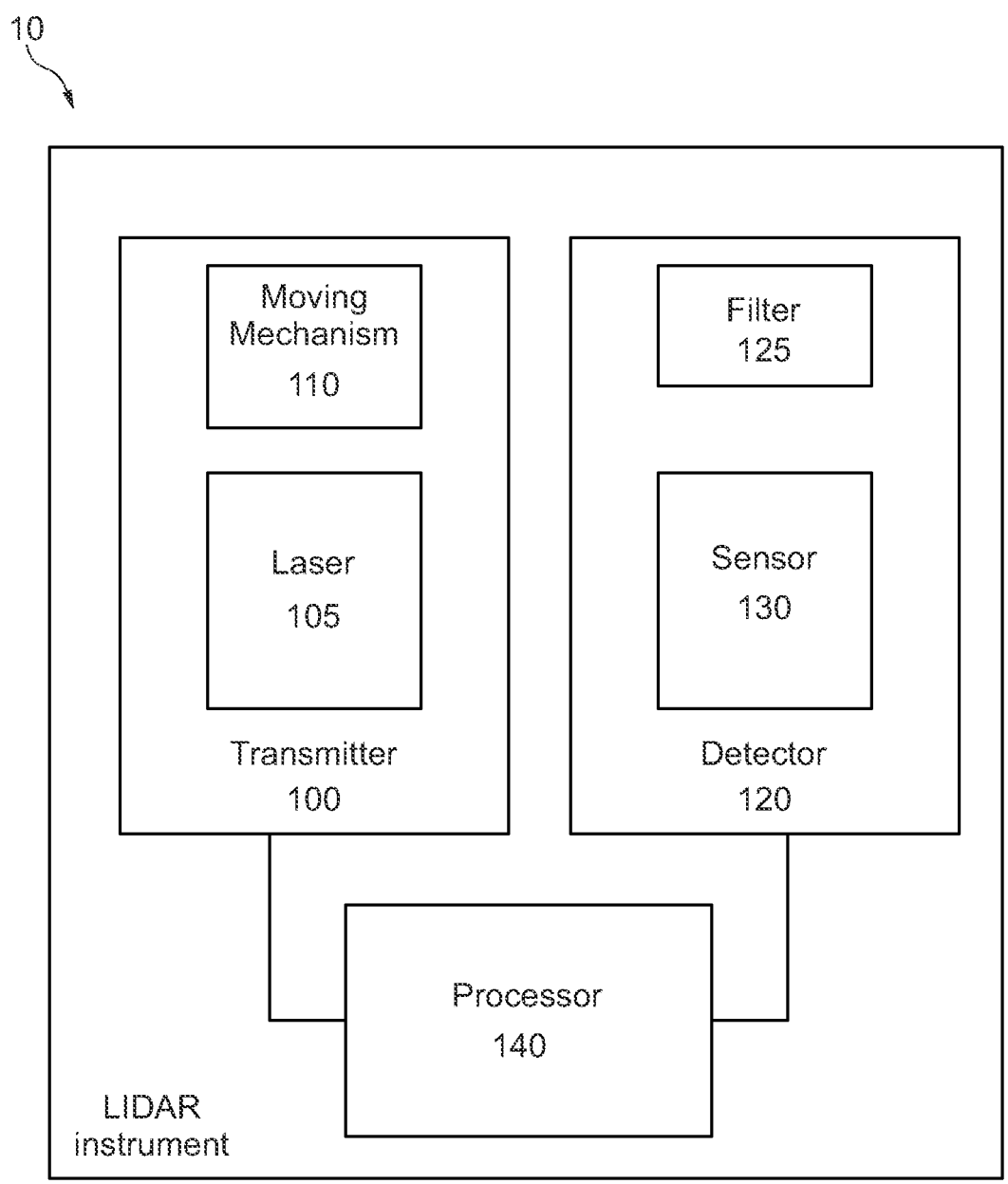
FIG. 1 shows a LIDAR instrument according to an embodiment.

LIDAR (Light Detection and Ranging) is a remote sensing technology which can be used to create 3D models and maps of objects and environments, or can be used to measure distances to objects. LIDAR can further be used to measure the velocity of an object moving relative to an observation point.

LIDAR works in a similar way as Radar or Sonar yet uses light waves from a laser instead of radio or sound waves. A LIDAR system/instrument sends out pulses of light and calculates how long it takes each pulse to return back to the detector. The distance is then calculated using velocity of light. These are known as 'Time of Flight' (ToF) measurements.

A Doppler or coherent LIDAR uses phase-coherent laser light to measure not only the distance to an object, but also the velocity of the object relative to the observation point by measuring the phase shift of the returning light.

A LIDAR instrument typically includes at least a laser (diode), a detector and a processor. LIDAR instruments can operate in different light spectrums such as near-infrared light or green light.

Different LIDAR instruments use different methods to move or spin the laser beam, but generally they sweep in a circle like a radar dish, while simultaneously moving the laser up and down. A LIDAR instrument may send out and receive thousands or millions of pulses per second and complete tens or hundreds of revolutions per second. The resulting "point cloud," as the collection of coordinates from returning laser pulses is called, can be remarkably detailed, showing all the contours of the environment and objects within it.

LIDAR is an example of a "Big Data" problem in that a successful operation requires the analysis of massive quantities of data to interpret the observer's (e.g., moving vehicle's) environment and make operation decisions in real time. Anything that improves the signal to noise ratio of the return signal is an advantage.

Current LIDAR instruments use 50 to 70 watt broad area (BA) lasers with free-running spectral envelope of more than 20 nm. The high power is necessary to detect the weak return signal over the daylight background. As the operating range of the LIDAR instrument is increased, LIDAR laser power must be increased too to account for the fact that the intensity of the return LIDAR signal is inversely proportional to the square of the distance. Automotive LIDAR instruments will require increasing powers to work at longer ranges. Laser power is expensive and high current pulsing is complex. Beam steering characteristics of BA laser diodes add further noise to the return signal. Therefore it is essential that laser power be used more efficiently.

Embodiments of the invention provide a LIDAR instrument that uses a narrow band (e.g., single mode) laser (diode) and a matching filter to maximize signal to noise ratio of the return signal. The narrow band laser diode may operate within a spectral envelope of equal or less than ≤1 nm, ≤2 nm, ≤3 nm or ≤4 nm and the matching bandpass filter may have a bandpass of ≤1 nm, ≤2 nm, ≤3 nm or ≤4 nm allowing a huge background noise reduction as compared to the current state of the art transmitter/detector systems for LIDAR instruments. For example, by reducing the bandpass of the filter from 20 nm to 2 nm, solar background is reduced by 90%, or 10 dB, by approximately constant background intensity over the bandpass of the filter.

Embodiments of the invention further provide a LIDAR instrument comprising a narrow band wavelength stabilized Distributed Feedback (DFB) laser (diode) or a narrow band wavelength Distributed Bragg Reflector (DBR) laser (diode) each with a (semiconductor) amplifier.

Various other embodiments provide a LIDAR instrument with a narrow band stabilized laser diode configured to emit electromagnetic waves or light in the spectrally-advantageous 9 XXnm, 13 XXnm-15 XXnm or 18 XXnm-1900 nm wavelength bands. In particular, a narrow band laser diode in the range of 935 nm-940 nm or 1380 nm-1550 nm is of interest. Providing a LIDAR instrument with a laser diode configured to operate in these ranges takes advantageously into account that the solar radiation is attenuated by the atmospheric water vapor columns for these ranges. This may advantageously further increase the signal to noise ratio of the return signal.

FIG. 1 shows a LIDAR instrument 10 such as a ToF LIDAR instrument according to an embodiment. The LIDAR instrument 10 comprises a transmitter 100, a detector 120 and a processor 140. The transmitter 100 comprises a narrow band laser diode 105 and a moving mechanism 110 for moving the beam of the laser diode 105. The transmitter 100 may include further optical and electronic elements. The detector 120 comprises a filter 125 and a sensor 130. The filter 125 may match the emission envelope of the narrow band laser diode 105. The detector 120 may include additional optical and electronic elements.

The narrow band laser diode 105 may be a single mode laser diode or a single spatial mode and single longitudinal mode laser diode. For example, the narrow band laser diode 105 may emit at a wavelength centered within an atmospheric absorption band, e.g., 935-940 nm, 1380-1550 nm, or 1800-2000 nm. In a particular embodiment, the center wavelength of the narrow band laser diode 105 overlaps with a molecular absorption band that attenuates solar radiation by at least 3 dB compared to a directly adjacent non-spectrally-attenuated wavelength band. Such adjacent bands may be the 800-930 nm band and the 950-1100 nm for the 935-940 nm band, 1200-1360 nm band and 1600-1750 nm band for the 1380-1500 nm band and the 1600-1750 nm band and the 1920-2400 nm band for the 1800-1900 nm band.

The narrow band laser diode 105 may be a narrow band Distributed Bragg Reflector (DBR) laser diode. Alternatively, the narrow band laser diode 105 may be narrow band Distributed Feedback (DFB) laser diode. The narrow band laser diode 105 may not be a fiber laser, gas laser or solid state laser. The narrow band laser diode 105 may be configured to emit radiation or light with a spectral envelope of ≤1 nm, ≤2 nm, ≤3 nm or ≤4 nm. When in operation, the narrow band laser diode 105 may provide an output peak power (with an amplifier) of equal or less than or equal to 2 W, 3 W, 4 W, 5 W, 10 W or 20 W. In various embodiments, the narrow band laser diode 105 can be operated (without the amplifier) with a seed peak power of less than or equal to 100 mW, 150 mW, 250 mW, 500 mW or 1000 mW.

The narrow band laser diode 105 may be a monolithic wavelength stabilized laser diode. The laser diode is stabilized by a monolithic element such as a grating designed to select one or more spectral (longitudinal) modes within a narrow band. A narrow band wavelength stabilized laser diode 105 requires advantageously less laser light, less drive current and simpler pulse electronics and therefore lower cost.

The beam of a single mode laser diode 105 can be focused and shaped with small optics, whereas multi-mode laser diodes require bulky optics.

The narrow band laser diode 105 may be pulsed. The laser diode 105 may be pulsed every 5 nsec but can have longer pulses such as 10 nsec, 20 nsec, etc. Alternatively, the laser diode 105 may have shorter pulses such as 1 nsec, 2 nsec or 3 nsec. The specific pulse duration and duty cycle may be determined by system requirements of the LIDAR instrument.

The beam of the narrow band laser diode 105 may be moved by the moving mechanism 110 to cover the field of view in front of the LIDAR instrument. The moving mechanism 110 may be a mechanical moving mechanism, such as a rotating mirror, or an electronic moving mechanism such as a liquid crystal or phased array.

Figure 2:
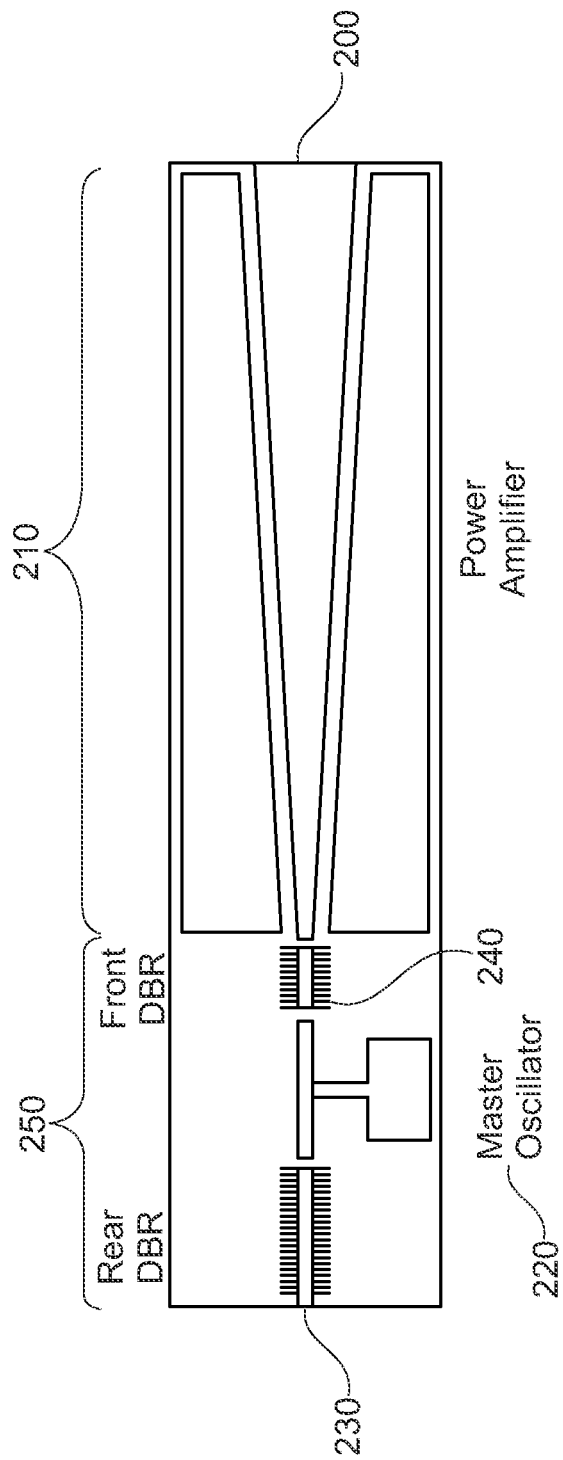
FIG. 2 shows a narrow band DBR laser diode according to an embodiment.

FIG. 2 shows an example of a narrow band DBR laser diode 105/200 with a laser section 250 and a power amplifier 210 according to an embodiment called a master oscillator power amplifier, or MOPA. The DBR laser diode 200 comprises a seed laser called a master oscillator 220, front and rear Distributed Bragg Reflectors 230 and 240 and a power amplifier 210. The power amplifier 210 may be arranged monolithically with the DBR laser section 250 and may be an integral part of the laser diode 200. The power amplifier 210 may be a tapered amplifier. The DBR laser diode 200 may be based on gallium arsenide (GaAs) for lasers in the 9XX nm range and on indium phosphide (InP) for lasers in the 14XX to 15XX range. The DBR laser diode 200 could be a quantum cascade laser for operation above 3000 nm. In an embodiment, a combination of a seed laser (DBR laser section 250) and a high power (tapered) amplifier 210 may ensure that the optical characteristics of the seed laser 250 are maintained in the amplified pulse.

For example, a narrow band single element DBR laser diode 200 at the solar attenuated wavelength of 935 nm may be available for continuous wave (CW) powers of up to 250 mW or more, and a narrow band DBR laser diode 200 at the wavelength of 976 nm may be available for continuous wave (CW) powers of up to 1000 mW. Alternatively, the DBR laser diode 200 may be a monolithic array comprising multiple laser diodes.

The narrow band single DBR or DFB laser diode 200 may be monolithically integrated with a power amplifier stage 210 that can increase the power output by up to a factor of 5, 8 or 10. Not only does this provide higher power output, but it also allows modulation or pulsing of the seed laser (master oscillator) 220 with small signals, with high power amplification by continuous wave current. Low current pulsing is more efficient and uses lower cost components than if the entire high current had to be pulsed or modulated at high rates.

Referring back to FIG. 1, the narrow band laser diode 105 should be matched with an appropriate optical filter 125 such as a bandpass filter. The optical bandpass filter 125 may be a narrow bandpass filter. The bandpass filter may pass radiation or light in the band and block (by absorption or interference) wavelengths at the short end and the long end of the band. The bandpass filter 125 may match the spectral envelope of the narrow band laser diode 105. For example, the narrow band laser diode 105 configured to emit radiation or light in a spectral envelope of equal to or less than 2 nm with a center wavelength in the range of 935 nm-940 nm (e.g., a center wavelength of 936 nm, 937 nm, 938 nm, 939 nm or 940 nm) should be matched with a bandpass filter 125 having a passband of equal to or less than 2 nm for the same center wavelength as the narrow band laser diode 105. The same is true for a matching a pair of narrow band laser diodes 105/bandpass filters 125 for a spectral envelope of equal to or less than 3 nm, 4 nm, 5 nm, etc.

The bandpass of the matching filter 125 may be larger than the bandwidth of the narrow band laser diode 125 to account for a wavelength shift of the laser diode due to temperature variations or drift due to aging. The matching filter bandwidth should be wide enough to transmit the full spectral range of the laser diode during operation, which may vary due to temperature, operating current and age. For example, the laser diode 105 with an envelope of 2 nm or less for a central wavelength may be matched with a narrow bandpass filter receiving reflected light in a band of 5 nm or less.

The sensor 130 detects the reflected optical signal (radiation) and transforms it into an electrical signal. The sensor 130 may be an array of complementary metal-oxide-semiconductor (CMOS) devices, charge-coupled devices (CCDs) or combinations thereof. The processor 140 measures the time difference between the radiation (light) leaving the LIDAR instrument and the radiation detected by the LIDAR instrument in order to calculate the ToF.

Power detection in a LIDAR instrument is noisy and requires a strong return signal. The return signal must be detected under a wide range of environmental conditions. In particular, the return signal must be greater than the background solar radiation.

The sun acts as a blackbody radiator with a temperature of about 6000 K. However, as sunlight is transmitted through the earth's atmosphere, it is attenuated at specific wavelengths due to atmospheric molecules, including water vapor, carbon dioxide, nitrous oxide, ozone, oxygen, and methane. Particular bands where the light is attenuated are the water vapor absorption bands of water vapor between 935 nm and 940 nm, 1100 nm and 1200 nm, 1400 nm and 1500 nm, and 1800 nm and 1900 nm.

Extensive measurements have been made of the solar spectral irradiance across the visible and infrared regions of the spectrum. For example, a detailed investigation of the solar spectrum in the Atacama Desert region of Chile reported in the Nature Magazine (Nature article) under "Scientific Reports" with the title "The Solar Spectrum in the Atacama Desert" authored by R. R. Cordero et al. and published Mar. 2, 2016. This Nature article is incorporated herein by reference in its entirety.

The Nature article reported solar spectrum measurements across a variety of conditions. At sea level measured at Antofagasta, Chile, spectral irradiance at 935-940 nm was approximately 100 mW/nm·m$^2$, as compared to 700 mW/nm·m$^2$ at 900 nm. Even greater attenuation was measured in the 1100 nm band (e.g., 1150 nm), 1400 nm band, and 1800 nm band (e.g., 1850 nm).

Operating a LIDAR instrument with a narrow band wavelength-stabilized laser diode and a matching filter would provide a reduction of solar background intensity from 14,000 mW/m$^2$ (for laser diode operating at 905 nm and a 20 nm filter) to 200 mW/m$^2$ (for a laser diode operating at 935-940 nm and a 2 nm filter) over an otherwise equivalent instrument. This is a factor of 17 less power required when operated by operating a narrow band laser within a spectroscopic band.

Accordingly, the narrow band of the laser diode allows better rejection of optical noise from ambient light using narrow bandpass filters, including the ability to operate at solar attenuated wavelengths (as further discussed below), where, e.g., solar radiation intensity is mitigated due to absorption by atmospheric water vapor. For example, water vapor absorption near 935 nm provides at least 3 dB attenuation of the solar background radiation (compared to an adjacent band). Further, wavelengths above 1380 nm offer greater eye safety, so that the vapor absorption band around 1380 nm to 1500 nm offers an operating region that is both eye safe and solar attenuated.

Most of today's LIDAR instruments use short coherence length multi-spatial mode lasers, which provide ToF information to scan the depth profile of the visual field in front of the instrument. They generally use 905 nm broad area (BA) lasers due to their ready accessibility and maturity. The high gain, high peak power capabilities of the GaAs laser materials at this wavelength, and the relatively low cost of detectors for that spectral region are ideal characteristics for early stage products. High peak power is necessary to achieve a desired range of >200 meters. Despite the high peak power, the short pulse duration keeps current systems within the limits of eye safety.

As discussed above a major issue with the current products is beam stability. Broad spectral output and mode instability leading to pointing instability increases the noise level of the return signal and decreases the range for a given power level.

Another issue with the current products is high current pulsing. Pulsing multi-tens of amps of current for nanosecond pulses requires complex, costly and bulky impedance matching electronics.

Embodiments provide a long coherence length narrow band laser diode 105 incorporated in LIDAR instruments 10.

Coherent LIDAR instruments such as coherent Doppler LIDAR instruments provide the ability to determine relative velocity of an object. Unlike incoherent ToF LIDAR instruments which determine the depth profile of a visual field using multi-spatial mode lasers conveying no phase information in the return signal, coherent LIDAR instruments can determine both time delay and phase shift of the return signal. Such coherent LIDAR instruments may require single spatial mode, single longitudinal mode, long coherence length laser. Time of flight LIDAR instruments may offer high spatial resolution and may use laser diodes of short coherence length, but coherent LIDAR instruments have the ability to measure the Doppler shift of moving objects allowing the determination of relative velocity from the phase shift of the return signal.

The DFB and DBR laser diodes may provide a laser beam having a coherence length of equal to or more than 10 meter coherence length, equal to or more than 20 meter coherence length or equal to or more than 50 meter coherence length. In some embodiments the laser diodes may provide a coherence length between 10 meters and 100 meter inclusive, between 10 meters and 200 meters inclusive or between 10 meters and 500 meters inclusive. The laser diode may include a so-called "discrete mode" laser architecture. A coherent LIDAR instrument may need a coherence length in the order of its operating range in order to measure the phase shift (>100 meters). The MOPA laser diode may generally have a shorter coherence length than the non-amplified version laser diode, i.e., the MOPA laser diode may have a relaxed coherence length requirement. The MOPA laser diodes may provide a laser beam having a coherence length of equal to or less than 10 meter coherence length, equal to or less than 8 meter coherence length or equal to or less than 50 meter coherence length Encoding of the coherent signal may enable resistance to spoofing and sensitivity to spurious signals providing a more robust LIDAR instrument.

The embodiment narrow band laser diodes at a solar-attenuated wavelength using heterodyne detection could achieve Doppler LIDAR at a fraction of the power of conventional LIDAR instruments while providing both range and velocity information. This may be important for full situational awareness. Further, low current pulsing and heterodyne detection allowing measurement of the phase shift of the return signal provide significant scalability advantages over the large current pulsing and direct detection of the incoherent LIDAR instruments.

Heterodyning is a signal processing technique that creates new frequencies by combining or mixing two frequencies. Heterodyning is used to shift one frequency range into another, new one, and can also be involved in the processes of modulation and demodulation. The two frequencies may be combined in a (non-linear) signal-processing device such as a transistor or diode called mixer. In a common application, two signals at frequencies $f_1$ and $f_2$ are mixed, creating two new signals, one at the sum $f_1+f_2$ of the two frequencies, and the other at the difference $f_1-f_2$. These new frequencies are called heterodynes. Typically only one of the new frequencies is desired, and the other signal is filtered out of the output of the mixer.

By choosing an embodiment narrow band wavelength (i.e., a specific frequency) and a proper down or up converting frequency a superior detection of the phase shift can be achieved.

Figure 3:
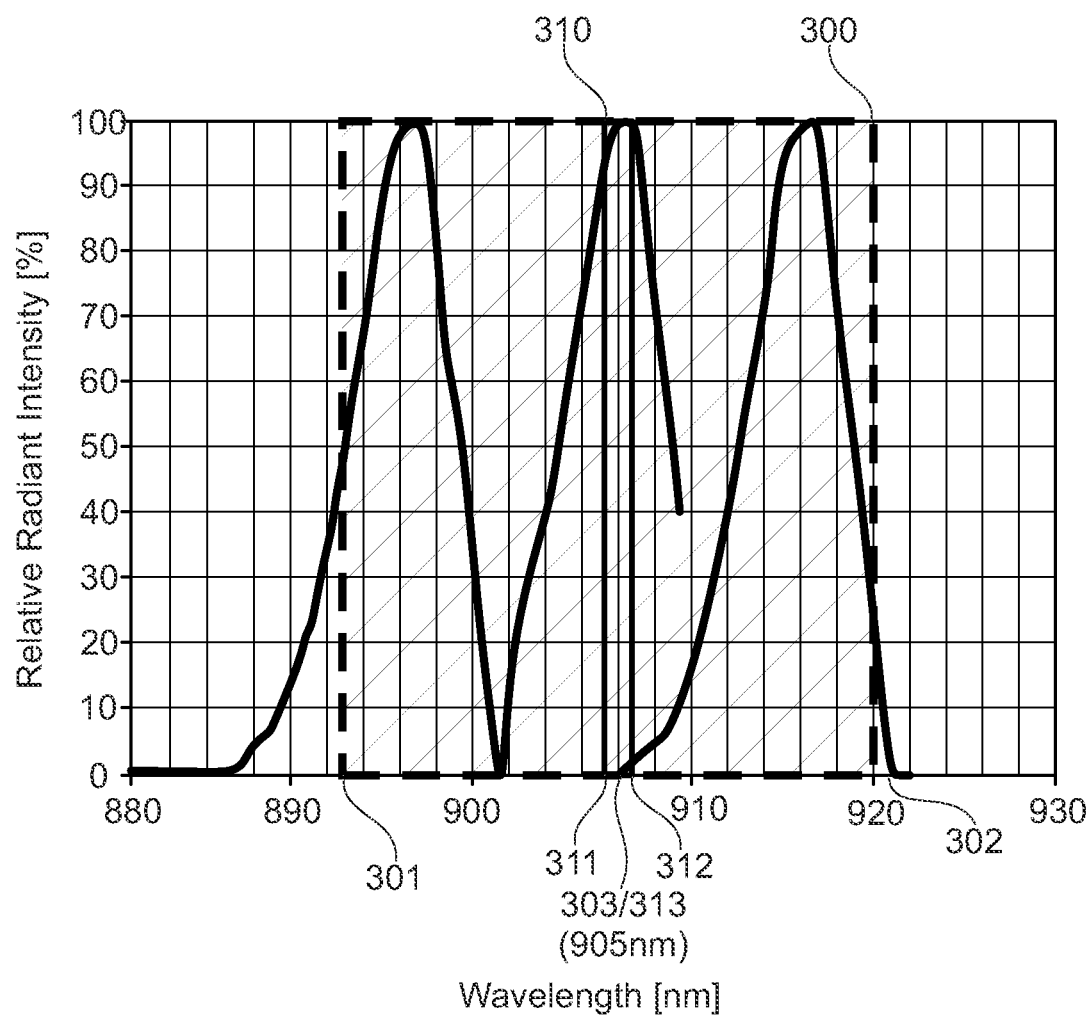
FIG. 3 shows spectral envelopes of a conventional laser diode and a laser diode according to an embodiment.

FIG. 3 a shows a spectral envelope 300 of a conventional laser and a spectral envelope 310 of a single mode laser diode according to embodiments. As can be seen the conventional laser has a spectral envelope 300 of 25 nm from the minimum 301 to the maximum 302 of a center wavelength 303 (of about 905 nm). In contrast, the spectral envelope 310 of the single mode laser diode according to the embodiments is 2 nm from the minimum 311 to the maximum 312 of the center wavelength 313 (of about 905 nm).

This single mode stabilized laser diode can be matched with an appropriate filter. For example, the filter may be narrow bandpass filter such as a 2 nm (3 nm, 4 nm) bandpass filter. The difference between a 2 nm bandpass filter and a 25 nm filter is a 10 dB to 13 dB reduction in solar background which substantially improves the signal to noise ratio of the detected or received signal.

Figure 4:
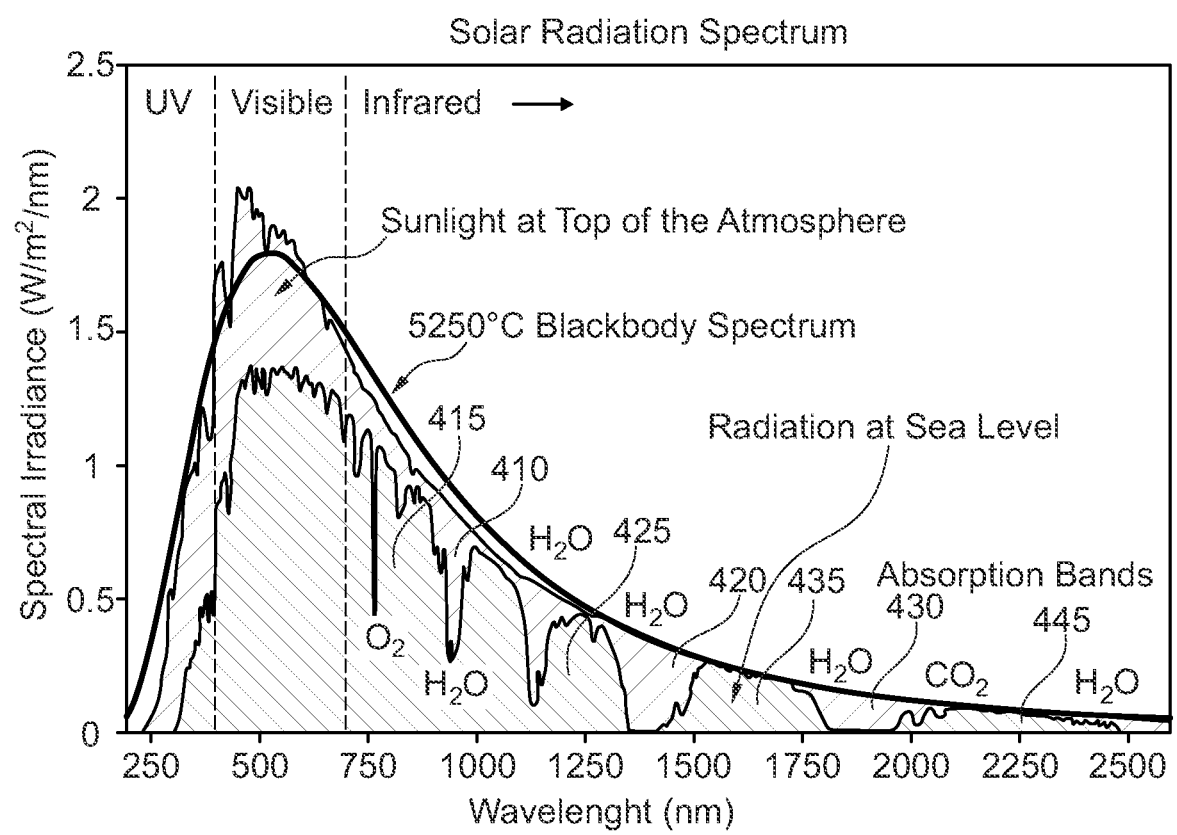
FIG. 4 shows a solar radiation spectrum.

FIG. 4 shows a solar radiation spectrum. As can be seen from FIG. 4, solar radiation is attenuated by the atmospheric molecular absorption bands at several bands 410, 420, 430. For example, the bands 935 nm-940 nm, 1380 nm-1500 nm, and 1800 nm-1900 nm are such bands. The atmospheric molecular absorption bands 410, 420, 430 may attenuate solar radiation by at least 3 dB, 3.5 dB or 4 dB compared to adjacent non-spectrally-attenuated wavelength bands 415, 425, 435, 445, wherein molecular absorption in the atmospheric molecular absorption bands is due to water vapor, carbon dioxide, oxygen, ozone, methane, or nitrous oxide. The bands 410, 420 and 430 may be of interest to automotive LIDAR instruments. The single mode lasers and matching narrow band filters will allow significantly improved signal to noise ratios due to reduced solar background when operated within these bands 410, 420 and 430. This would substantially improve LIDAR instruments for automotive applications in particular when the vehicle (e.g., car) is operated in perpetual twilight LIDAR.

Figure 5:
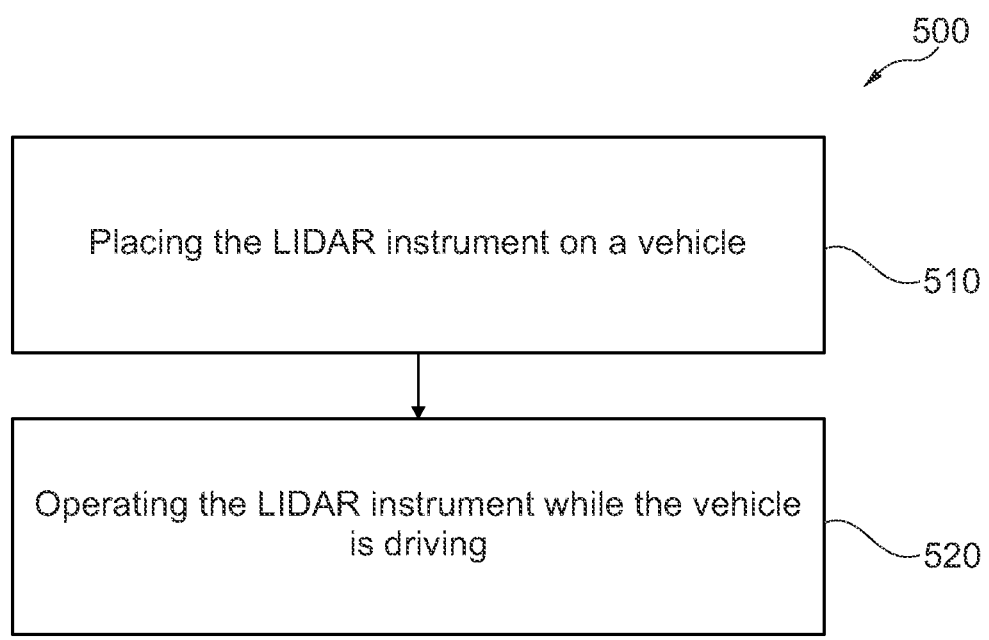
FIG. 5 shows a method for operating a LIDAR instrument according to an embodiment.

FIG. 5 shows a method 500 for operating a LIDAR instrument on a vehicle. In a first method step 510 the LIDAR instrument according to embodiments is placed on a vehicle. The vehicle may be a motorbike, a car, a truck, an aircraft, a boat or any other movable device. The LIDAR instrument may comprise a coherent (long coherence length) laser emitting coherent radiation or light. Alternatively, the LIDAR instrument may comprise an incoherent (short coherence length) laser emitting incoherent radiation. In a second method step 520 the LIDAR instrument is operated while the vehicle is driving. The operation of the vehicle is based on measurements of the LIDAR instrument. In various embodiments the measurements may use coherent light emitted by the single mode laser of the LIDAR instrument in order to determine movements of nearby objects (based on the Doppler shift). In various other embodiments the measurements may be based on incoherent light emitted by the single mode laser.

Example 1

A LIDAR instrument includes a transmitter including a narrow band laser diode configured to emit light in a spectral envelope of 2 nm or less around a central wavelength, where the spectral envelope overlaps with an atmospheric molecular absorption band in which solar radiation is attenuated by at least 3 dB compared to an adjacent non-spectrally-attenuated wavelength band, where an molecular absorption in the atmospheric molecular absorption band is due to water vapor, carbon dioxide, oxygen, ozone, methane, or nitrous oxide, and where the atmospheric molecular absorption band is located between 700 nm and 10,000 nm; and a detector including a filter configured to receive a reflected light in a band of 5 nm or less around the central wavelength.

Example 2

The LIDAR instrument according to example 1, where the LIDAR instrument is configured to emit and receive the light with the central wavelength selected from a central wavelength between 935 nm and 940 nm inclusive.

Example 3

The LIDAR instrument according to one of examples 1 or 2, where the LIDAR instrument is configured to emit and receive the light with the central wavelength selected from a central wavelength between 1380 nm and 1500 nm inclusive.

Example 4

The LIDAR instrument according to one of examples 1 to 3, where the LIDAR instrument is configured to emit and receive the light with the central wavelength selected from a central wavelength between 1800 nm and 1900 nm inclusive.

Example 5

The LIDAR instrument according to one of examples 1 to 4, where the narrow band laser diode is a distributed Bragg reflector (DBR) laser diode.

Example 6

The LIDAR instrument according to one of examples 1 to 5, where the narrow band laser diode is a distributed feedback (DFB) laser diode.

Example 7

The LIDAR instrument according to one of examples 1 to 6, where the narrow band laser diode is a master oscillator power amplifier (MOPA) laser diode with a low power seed DBR laser diode and a monolithic power amplifier.

Example 8

The LIDAR instrument according to one of examples 1 to 7, where the narrow band laser diode is a master oscillator power amplifier (MOPA) laser diode with a low power seed DFB laser diode and a monolithic power amplifier.

Example 9

The LIDAR instrument according to one of examples 1 to 8, where the LIDAR instrument is a time-of-flight (ToF) LIDAR.

Example 10

The LIDAR instrument according to one of examples 1 to 9, where the LIDAR instrument is a Doppler LIDAR instrument.

Example 11

The LIDAR instrument according to one of examples 1 to 10, where the narrow band laser diode provides a coherence length of greater than or equal to 10 meters.

Example 12

The LIDAR instrument according to one of examples 1 to 11, where the narrow band laser diode provides a coherence length of less than 10 meters.

Example 13

The LIDAR instrument according to one of examples 1 to 12, where the narrow band laser diode is a single spatial and single longitudinal mode laser diode.

Example 14

A LIDAR instrument includes a transmitter including a narrow band laser diode configured to emit light in a spectral envelope of 2 nm or less around a central wavelength, where the emitted light includes a coherence length of equal to or more than 10 meters; and a detector including a filter configured to receive a reflected light and to measure a phase shift in the reflected light.

Example 15

The LIDAR instrument according to example 14, where the LIDAR instrument is configured to emit the light with the central wavelength selected from a central wavelength between 935 nm and 940 nm inclusive.

Example 16

The LIDAR instrument according to one of examples 14 or 15, where the LIDAR instrument is configured to emit the light with the central wavelength selected from a central wavelength between 1380 nm and 1500 nm inclusive.

Example 17

The LIDAR instrument according to one of examples 14 to 16, where the LIDAR instrument is configured to emit the light with the central wavelength selected from a central wavelength between 1800 nm and 1900 nm inclusive.

Example 18

The LIDAR instrument according to one of examples 14 to 17, where the LIDAR instrument is configured to encode the coherent light.

Example 19

A LIDAR instrument includes a transmitter including a narrow band laser diode configured to emit light in a spectral envelope of 2 nm or less around a central wavelength; and a detector including a filter configured to receive a reflected light in a band of 5 nm or less around the central wavelength.

Example 20

The LIDAR instrument according to example 19, where the narrow band laser diode has a peak power of less than or equal to 20 W.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A LIDAR instrument comprising:
a transmitter including a master oscillator power amplifier (MOPA) laser diode comprising a low power seed distributed Bragg reflector (DBR) laser diode and a monolithic power amplifier configured to emit light in a single longitudinal and spatial mode within a spectral envelope of 2 nm or less around a central wavelength,
wherein the spectral envelope overlaps with an atmospheric molecular absorption band in which solar radiation is attenuated by at least 3 dB compared to an adjacent non-spectrally-attenuated wavelength band,
wherein an molecular absorption in the atmospheric molecular absorption band is due to water vapor, carbon dioxide, oxygen, ozone, methane, or nitrous oxide,
wherein the MOPA laser diode is configured to:
emit the mode at the central wavelength within the band so that the atmospheric attenuation of the mode is maximized, and
maintain a stability of the mode so that the central wavelength is maintained as a constant wavelength, and
wherein the atmospheric molecular absorption band is located between 700 nm and 10,000 nm; and
a detector including a filter configured to receive reflected light in a band of 5 nm or less around the central wavelength.

2. The LIDAR instrument according to claim 1, wherein the LIDAR instrument is configured to emit and receive the light with the central wavelength selected from a central wavelength between 935 nm and 940 nm inclusive.

3. The LIDAR instrument according to claim 1, wherein the LIDAR instrument is configured to emit and receive the light with the central wavelength selected from a central wavelength between 1380 nm and 1500 nm inclusive.

4. The LIDAR instrument according to claim 1, wherein the LIDAR instrument is configured to emit and receive the light with the central wavelength selected from a central wavelength between 1800 nm and 1900 nm inclusive.

5. The LIDAR instrument according to claim 1, wherein the LIDAR instrument is a time-of-flight (ToF) LIDAR.

6. The LIDAR instrument according to claim 1, wherein the LIDAR instrument is a Doppler LIDAR instrument.

7. The LIDAR instrument according to claim 1, wherein the MOPA laser diode provides a coherence length of greater than or equal to 10 meters.

8. The LIDAR instrument according to claim 1, wherein the MOPA laser diode provides a coherence length of less than 10 meters.

9. A LIDAR instrument comprising:
a transmitter including a narrow band laser diode configured to emit light in a spectral envelope of 2 nm or less around a central wavelength,
wherein the narrow band laser diode is a master oscillator power amplifier (MOPA) laser diode comprising a low power seed distributed feedback (DFB) laser diode and a monolithic power amplifier,
wherein the spectral envelope overlaps with an atmospheric molecular absorption band in which solar radiation is attenuated by at least 3 dB compared to an adjacent non-spectrally-attenuated wavelength band,
wherein an molecular absorption in the atmospheric molecular absorption band is due to water vapor, carbon dioxide, oxygen, ozone, methane, or nitrous oxide, and
wherein the atmospheric molecular absorption band is located between 700 nm and 10,000 nm; and
a detector including a filter configured to receive reflected light in a band of 5 nm or less around the central wavelength.

10. The LIDAR instrument according to claim 9, wherein the LIDAR instrument is configured to emit and receive the light with the central wavelength selected from a central wavelength between 935 nm and 940 nm inclusive.

11. The LIDAR instrument according to claim 9, wherein the LIDAR instrument is configured to emit and receive the light with the central wavelength selected from a central wavelength between 1380 nm and 1500 nm inclusive.

12. The LIDAR instrument according to claim 9, wherein the LIDAR instrument is configured to emit and receive the light with the central wavelength selected from a central wavelength between 1800 nm and 1900 nm inclusive.

13. The LIDAR instrument according to claim 9, wherein the LIDAR instrument is a time-of-flight (ToF) LIDAR.

14. The LIDAR instrument according to claim 9, wherein the LIDAR instrument is a Doppler LIDAR instrument.

15. The LIDAR instrument according to claim 9, wherein the narrow band laser diode provides a coherence length of greater than or equal to 10 meters.

16. The LIDAR instrument according to claim 9, wherein the narrow band laser diode provides a coherence length of less than 10 meters.

17. The LIDAR instrument according to claim 9, wherein the narrow band laser diode is a single spatial and single longitudinal mode laser diode.

18. The LIDAR instrument according to claim 1, wherein a seed peak power of the low power seed laser diode is less than or equal 150 mW.

19. The LIDAR instrument according to claim 9, wherein a seed peak power of the low power seed laser diode is less than or equal 150 mW.

* * * * *